United States Patent
Kim

(10) Patent No.: US 7,816,700 B2
(45) Date of Patent: Oct. 19, 2010

(54) LIGHT EMITTING DIODE EMPLOYING AN ARRAY OF NANORODS AND METHOD OF FABRICATING THE SAME

(75) Inventor: Hwa Mok Kim, Seoul (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 79 days.

(21) Appl. No.: 12/063,674

(22) PCT Filed: Jun. 5, 2006

(86) PCT No.: PCT/KR2006/002148

§ 371 (c)(1),
(2), (4) Date: Feb. 12, 2008

(87) PCT Pub. No.: WO2007/021069

PCT Pub. Date: Feb. 22, 2007

(65) Prior Publication Data

US 2008/0210956 A1        Sep. 4, 2008

(30) Foreign Application Priority Data

Aug. 19, 2005   (KR) ................... 10-2005-0076205

(51) Int. Cl.
    *H01L 29/26* (2006.01)
(52) U.S. Cl. ................ 257/98; 257/79; 257/94; 257/432
(58) Field of Classification Search ............ 257/79, 257/94, 98, 432
    See application file for complete search history.

(56) References Cited

U.S. PATENT DOCUMENTS

| 6,340,822 | B1 * | 1/2002  | Brown et al. ........... 257/25 |
| 6,882,051 | B2   | 4/2005  | Majumdar et al. |
| 2005/0082545 | A1 * | 4/2005 | Wierer et al. ........... 257/79 |
| 2005/0194598 | A1 * | 9/2005 | Kim et al. ............... 257/79 |
| 2006/0292839 | A1 * | 12/2006 | Yi et al. ................. 438/570 |

FOREIGN PATENT DOCUMENTS

| JP | 14-084037 | 3/2002 |
| KR | 10-2001-0003987 | 1/2001 |
| KR | 10-2004-0008962 | 1/2004 |
| KR | 10-2005-0081139 | 8/2005 |
| WO | WO2004/109815 | 12/2004 |

* cited by examiner

*Primary Examiner*—Tan N Tran
(74) *Attorney, Agent, or Firm*—H.C. Park & Associates, PLC

(57) ABSTRACT

Disclosed are a light emitting diode employing an array of nanorods and a method of fabricating the same. The light emitting diode comprises an array of semiconductor nanorods positioned on a substrate. An upper electrode layer is deposited on the array of the nanorods such that an empty space remains between adjacent ones of the nanorods. Since the space between adjacent ones of the nanorods is not filled with an insulating material, the light extraction efficiency of a light emitting diode can be improved and a method of fabricating the light emitting diode can be simplified.

6 Claims, 3 Drawing Sheets

LIGHT EMITTING DIODE EMPLOYING AN ARRAY OF NANORODS AND METHOD OF FABRICATING THE SAME

RELATED APPLICATIONS

This application is a U.S. national phase application of PCT International Application No. PCT/KR2006/002148, filed Jun. 5, 2006, which claims priority of Korean Patent Application No. 10-2005-0076205, filed Aug. 19, 2005, the contents of which are incorporated herein by reference in their entirety.

FIELD OF THE INVENTION

The present invention relates to a light emitting diode and a method of fabricating the same, and more particularly, to a light emitting diode employing an array of nanorods and a method of fabricating the light emitting diode.

BACKGROUND OF THE INVENTION

In general, a light emitting diode is formed by sequentially stacking an n-GaN layer doped with n-type impurities, an InGaN active layer and a p-GaN layer doped with p-type impurities on a sapphire substrate. Since there are a great deal of threading dislocations caused by lattice mismatching due to physical properties of GaN or limitations on growth methods of GaN, such a laminated light emitting diode has limitations on light-emission efficiency. Further, the laminated light emitting diode has disadvantages such as a broad spectrum width and a large output variation in addition to the threading dislocations.

To overcome these disadvantages of the laminated light emitting diode, there have been conducted studies on a light emitting diode having a nanostructure in which a p-n junction is formed of one-dimensional nanorods or nanowires. Nanorods grown through the bottom-up scheme greatly reduce threading dislocations that might be produced in a laminated light emitting diode, resulting in improved light-emission efficiency. A light emitting diode employing an array of such nanorods secures higher light output as compared with a laminated light emitting diode.

Meanwhile, to supply electric power to the array of the nanorods, electrodes should be connected to upper and lower portions of the nanorods. Although the nanorods may be grown on a lower electrode so that the nanorods can be electrically connected to the lower electrodes, upper electrodes are formed on the nanorods through an additional process.

An example of a method of forming upper electrodes on an array of nanorods has been disclosed in U.S. Pat. No. 6,882,051 entitled "Nanowires, nanostructures and devices fabricated therefrom" by Majumdar et al. Further, an example of a method of selectively depositing nanometer-sized metal on specific regions of nanorods has been disclosed in International Publication No. WO2004/109815 entitled "Contacts fabric using heterostructure of metal/semiconductor nanorods and fabrication method thereof" by YI et al.

In U.S. Pat. No. 6,882,051 (see FIG. 30), nanowires are formed and then are embedded in a polymer matrix by flowing a polymer solution. Subsequently, the polymer is cured, the polymer matrix is etched until the nanowires are exposed, and then metal is deposited thereon. Accordingly, a metallic bonding pad, i.e., an upper electrode, is formed. According to this method, the nanowires with weak mechanical strength are embedded in the polymer matrix to provide enhanced mechanical strength.

However, in a case where such an array of nanowires is employed to form a light emitting diode, light absorption of the polymer matrix leads to light loss. Thus, light extraction efficiency that relates to extraction of light out of the array of the nanowires is reduced. Additionally, the processes for forming the polymer matrix and etching the polymer matrix are added, resulting in complicated fabrication processes of a light emitting diode.

Meanwhile, in the International Publication No. WO2004/109815, semiconductor nanorods are grown on a predetermined substrate, and metal is deposited on predetermined regions of the nanorods by means of a method such as sputtering or a thermal or electron beam evaporation method. The nanorods and the metal are contacted together such that an ohmic or schottky property is exhibited.

According to the International Publication No. WO2004/109815, a nanometer-sized metal electrode is formed on a certain portion of each of the nanorods so as to provide an electrode structure applicable to various devices.

However, as the nanometer-sized metal electrode is formed on a certain portion of each of the nanorods, an additional metal layer is required to simultaneously drive an array of nanorods. A process of forming such an additional metal layer makes the fabricating method of a light emitting diode complicated.

An object of the present invention is to provide a light emitting diode employing an array of nanorods, which has improved light extraction efficiency.

Another object of the present invention is to provide a light emitting diode employing an array of nanorods, which can be fabricated through simplified processes.

A further object of the present invention is to provide a method of fabricating a light emitting diode employing an array of nanorods and having improved light extraction efficiency.

To achieve these objects of the present invention, the present invention provides a light emitting diode employing an array of nanorods and a method of fabricating the same. A light emitting diode according to an aspect of the present invention comprises an array of semiconductor nanorods positioned on a substrate. An upper electrode layer is deposited and positioned on the array of nanorods such that an empty space remains between adjacent ones of the nanorods. According to the aspect of the present invention, since the space between adjacent ones of the nanorods is not filled with an insulating substance such as a polymer, the light extraction efficiency of the light emitting diode can be improved. Further, since the upper electrode layer is formed by being deposited directly on the array of the nanorods, a method of fabricating the light emitting diode can be simplified.

Each of the nanorods may comprise a first semiconductor nanorod of a first conductive type and a second semiconductor nanorod of a second conductive type. Further, an active layer may be interposed between the first and second semiconductor nanorods.

As the interval between adjacent ones of the second semiconductor nanorods becomes smaller, the upper electrode layer may be formed using a variety of deposition methods.

Preferably, the second semiconductor nanorods may be spaced apart from one another at an interval of 200 nm or less on the average.

The upper electrode layer may be made of a transparent electrode material. Further, an upper electrode pad may be formed on the upper electrode layer. Since the upper electrode layer is made of the transparent electrode material, light emitted from the nanorods can be radiated to the outside by passing through the upper electrode layer.

Additionally, a lower electrode layer of the first conductive type may be interposed between the substrate and the array. The nanorods are grown on the lower electrode layer.

Meanwhile, the lower electrode layer may have an extension portion extending from a side of the array of the nanorods. A lower electrode pad may be formed on the extension portion. Accordingly, bonding wires can be connected to the lower and upper electrode pads to supply electric power so that the array of the nanorods can be driven.

On the contrary, in a case where the substrate is conductive, the lower electrode pad may be formed on a bottom surface of the substrate. Accordingly, a larger number of nanorods can be disposed in one array so that light output can be increased.

A method of fabricating a light emitting diode according to another aspect of the present invention comprises growing nanorods on a substrate. An upper electrode layer is deposited on the nanorods such that an empty space remains between adjacent ones of the nanorods. Accordingly, it is possible to fabricate a light emitting diode with improved light extraction efficiency.

The upper electrode layer may be formed using a variety of deposition techniques such as physical vapor deposition, chemical vapor deposition, electroplating and electroless plating techniques, with considering stepcoverage characteristics thereof. For example, the physical vapor deposition technique may be sputtering, a thermal evaporation method or an electron beam evaporation method. Sputtering, or the thermal or electron beam evaporation method is advantageous to mass production of light emitting diodes, and reduces fabricating costs thereof.

Prior to the growth of the nanorods, a lower electrode layer may be formed on the substrate. The lower electrode layer may be a semiconductor layer of the first conductive type.

Additionally, the lower electrode layer may be exposed by patterning the upper electrode layer and the nanorods. A lower electrode pad may be formed on the exposed portion of the lower electrode layer. Further, an upper electrode pad may be formed on the upper electrode layer.

The nanorods may be grown using for example, MOCVD, MBE, MOHVPE or the like. The nanorods may be grown using such a technique without using a catalytic metal or a template.

According to the present invention, the upper electrode layer is deposited such that an empty space remains between adjacent ones of the nanorods, thereby preventing light absorption by a polymer matrix or the like and thus enhancing the light extraction efficiency of a light emitting diode. Further, since the upper electrode layer can be formed using a simple process, processes of fabricating a light emitting diode can be simplified and fabricating costs can be reduced.

DETAILED DESCRIPTION

Figure 1:
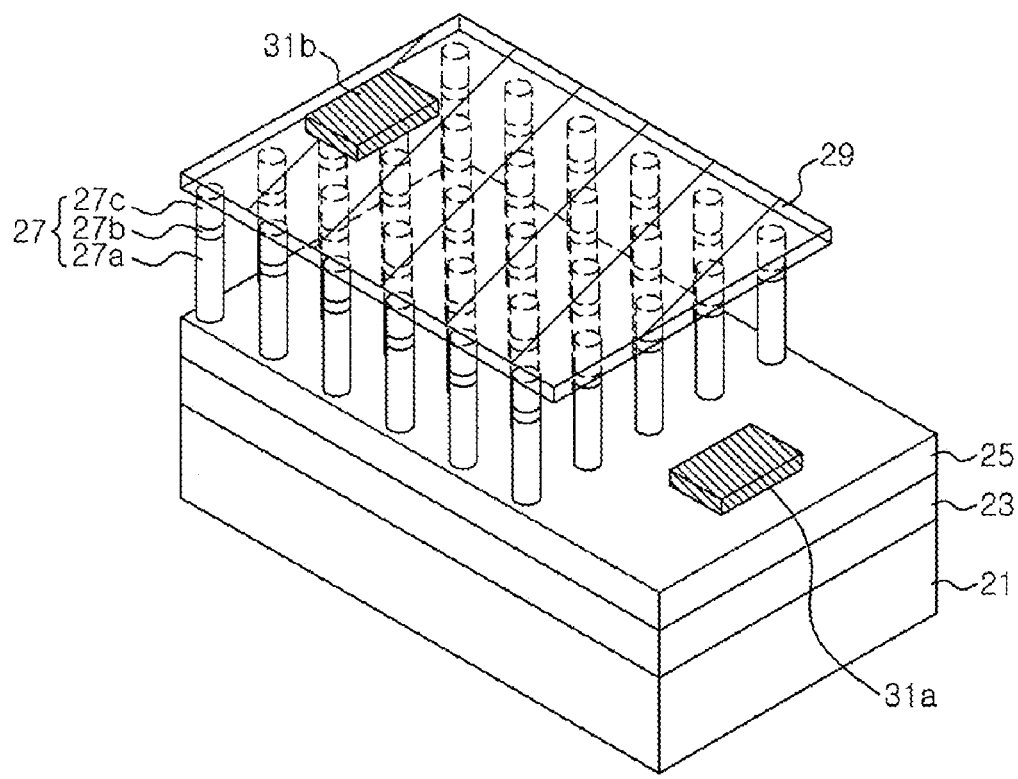
FIG. 1 is a perspective view illustrating a light emitting diode according to an embodiment of the present invention.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements are exaggerated for convenience of illustration. Like reference numerals indicate like elements throughout the specification and drawings.

FIG. 1 is a perspective view illustrating a light emitting diode according to an embodiment of the present invention.

Referring to FIG. 1, an array of nanorods 27 is positioned on a substrate 21. The substrate 21 may be a sapphire, glass, Si, SiC or ZnO substrate, and may be an insulative or conductive substrate.

Each of the nanorods 27 comprises a first semiconductor nanorod 27a of a first conductive type, and a second semiconductor nanorod 27c of a second conductive type.

Here, first and second conductive type semiconductors refer to n-type and p-type semiconductors, or p-type and n-type semiconductors, respectively. An active layer 27b is interposed between the first and second semiconductor nanorods 27a and 27c. Each of the first and second nanorods 27a and 27c may be made of $Al_xIn_yGa_{(1-x-y)}N$ ($0 \leq x \leq 1$, $0 \leq y < 1$ and $0 \leq x+y \leq 1$) or ZnO. The active layer 27b may be made of $(Al_xIn_yGa_{(1-x-y)})N$ ($0 \leq x < 1$, $0 \leq y \leq 1$ and $0 \leq x+y \leq 1$). The bandgap of GaN is varied according to the content of Al and In. Thus, the content of Al and/or In contained in the active layer is selected depending on a required wavelength of light, and the content of Al and/or In contained in each of the first and second nanorods 27a and 27c is selected such that each of the first and second nanorods has a bandgap larger than that of the active layer 27b.

The active layer 27b may be a single quantum well or multi quantum well. The multi quantum well may be formed by alternately growing substances that have large and small bandgaps.

The first semiconductor nanorod 27a, the active layer 27b and the second semiconductor nanorod 27c may be consecutively grown using a conventional vapor-liquid-solid (VLS) process as disclosed in U.S. Pat. No. 6,882,051 or using an MOCVD, MBE or MOHVPE technique. If the MOCVD, MBE or MOHVPE technique is used, a nanorod may be grown without using a catalytic metal or a template.

Meanwhile, a lower electrode layer 25 may be interposed between the substrate 21 and the array of the nanorods. The lower electrode layer 25 is used as an electrode electrically connected to the first nanorods 27a to supply electric power thereto. Particularly, in a case where the substrate 21 is an insulative substrate, the lower electrode layer 25 is interposed to supply electric power to the nanorods 27. The lower electrode layer 25 may be a layer made of the same conductive type semiconductor as the first semiconductor nanorod 27a.

The lower electrode layer 25 may have an extension portion extending from the array of the nanorods 27, and a lower electrode pad 31a may be formed on the extension portion. The electrode pad 31a may be formed of, but not limited to, a Ti/Al layer, and a wire (not shown) may be bonded thereto.

Additionally, a buffer layer 23 may be interposed between the lower electrode layer 25 and the substrate 21. The buffer layer 23 may be used to alleviate the lattice mismatch between the substrate 21 and the lower electrode layer 25.

In a case where the substrate 21 is a conductive substrate, the buffer layer 23 and the lower electrode layer 25 may be omitted, and the substrate 21 may serve as a lower electrode.

Meanwhile, an upper electrode layer 29 is positioned on the array of the nanorods 27. The upper electrode layer 29 is formed through deposition on the array such that an empty space remains between adjacent ones of the nanorods 27. The upper electrode layer 29 may be deposited using a physical vapor deposition, chemical vapor deposition, electroplating or electroless plating technique, Particularly, the upper electrode layer may be deposited using a physical vapor deposition technique such as sputtering, a thermal evaporation method or an electron beam evaporation method.

The upper electrode layer 29 may be made of various metallic materials or a conductive oxide film, particularly, a transparent electrode material, e.g., Ni/Au or indium tin oxide (TTO). The upper electrode layer 29 is commonly in ohmic or schottky contact with the second nanorods 27c.

An upper electrode pad 31b to be connected to a bonding wire may be formed on the upper electrode layer 29.

FIGS. 2 to 6 are sectional views illustrating a method of fabricating the light emitting diode according to the embodiment of the present invention.

Figure 2:
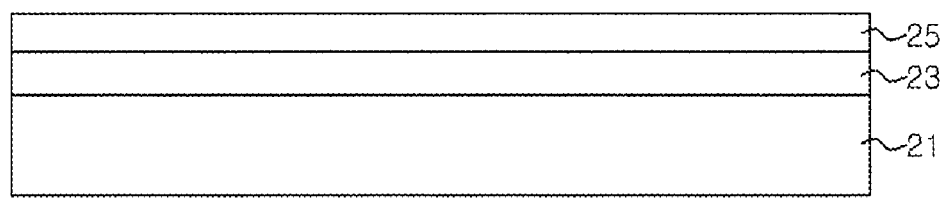
FIGS. 2 to 6 are sectional views illustrating a method of fabricating the light emitting diode according to the embodiment of the present invention.

Referring to FIG. 2, a substrate 21 is prepared. The substrate 21 may be a sapphire, glass, Si, SiC or ZnO substrate, and may be an insulative or conductive substrate.

A lower electrode layer 25 may be formed on the substrate 21. Particularly, in a case where the substrate 21 is an insulative substrate, a conductive lower electrode layer 25 is formed on the substrate 21. The lower electrode layer 25 may be formed of a first conductive type semiconductor. For example, the lower electrode layer 25 may be made of $Al_xIn_yGa_{(1-x-y)}N$ ($0 \leq x \leq 1$, $0 \leq y \leq 1$ and $0 \leq x+y \leq 1$) or ZnO. In a case where the lower electrode layer 25 is $Al_xIn_yGa_{(1-x-y)}N$, it can be formed into a p-type semiconductor layer by doping Mg, or an n-type semiconductor layer by doping Si or without artificial doping. Meanwhile, in a case where the lower electrode layer 25 is ZnO, Mg may be added.

Meanwhile, prior to the formation of the lower electrode layer 25, a buffer layer 23 may be formed. The buffer layer 23 may be used to alleviate the lattice mismatch between the lower electrode layer 25 and the substrate 21.

In a case where the substrate is a conductive substrate, the buffer layer 23 and/or the lower electrode layer 25 may be omitted.

Figure 3:
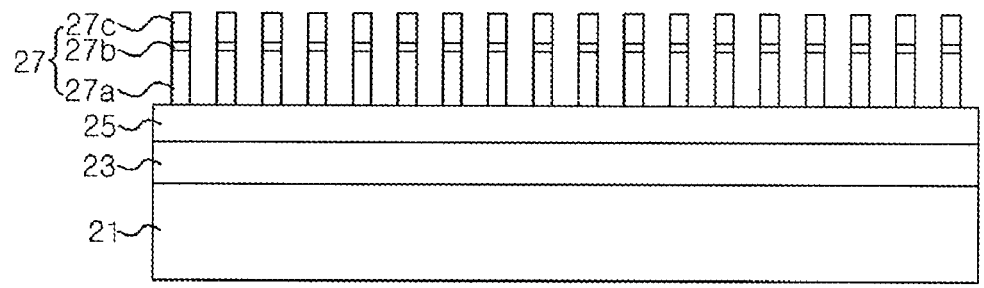

Referring to FIG. 3, nanorods 27 are formed on the lower electrode layer 25. Each of the nanorods 27 comprises a first semiconductor nanorod 27a of a first conductive type, and a second semiconductor nanorod 27c of a second conductive type, and an active layer 27b is interposed between the first and second semiconductor nanorods 27a and 27c.

The first and second nanorods 27a and 27c may be made of $Al_xIn_yGa_{(1-x-y)}N$ ($0 \leq x \leq 1$, $0 \leq y < 1$ and $0 \leq x+y \leq 1$) or ZnO. In a case where the nanorods 27a and 27c are made of ZnO, Mg may be added. Meanwhile, the active layer 27b may be made of $(Al_xIn_yGa_{(1-x-y)})N$ ($0 \leq x < 1$, $0 \leq y \leq 1$ and $0 \leq x+y \leq 1$), and the amounts of Al and In are selected depending on light with a required wavelength. The active layer 27b may be a single quantum well formed as a single layer or a multi quantum well in which substances with different bandgaps are alternately formed.

The first semiconductor nanorod 27a, the active layer 27b and the second semiconductor nanorod 27c may be consecutively grown using a vapor-liquid-solid (VLS) process or using an MOCVD, MBE or MOHVPE technique. If the MOCVD, MBE or MOHVPE technique is used, a nanorod may be grown without using a catalytic metal or a template.

The nanorods 27 are formed while being spaced apart from one another, and are preferably formed at an interval of 200 nm or less on the average.

Figure 4:
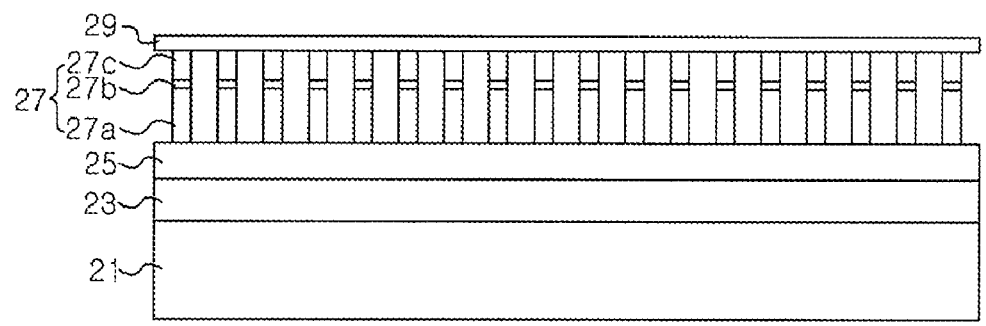

Referring to FIG. 4, an upper electrode layer 29 is deposited on the nanorods 27. The upper electrode layer 29 may be made of metal or a conductive oxide film. Particularly, the upper electrode layer 29 may be deposited with a transparent material, e.g., Ni/Au or ITO.

The upper electrode layer 29 may be deposited using a physical vapor deposition, chemical vapor deposition, electroplating or electroless plating technique. Particularly, the upper electrode layer may be deposited using a physical vapor deposition technique such as sputtering, a thermal evaporation method or an electron beam evaporation method. The deposition technique for the upper electrode layer 29 is selected in consideration of its stepcoverage characteristic.

Figure 5:
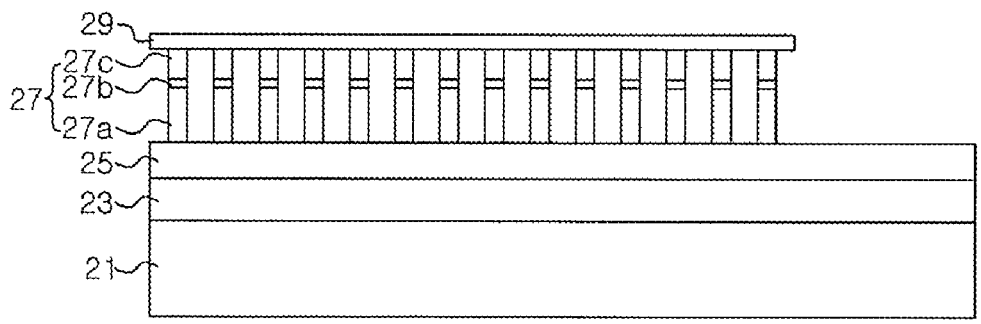

Referring to FIG. 5, the upper electrode layer 29 and the nanorods 27 are patterned to expose the lower electrode layer 25. The upper electrode layer 29 and the nanorods 27 may be patterned using photolithographic and etching processes.

Figure 6:
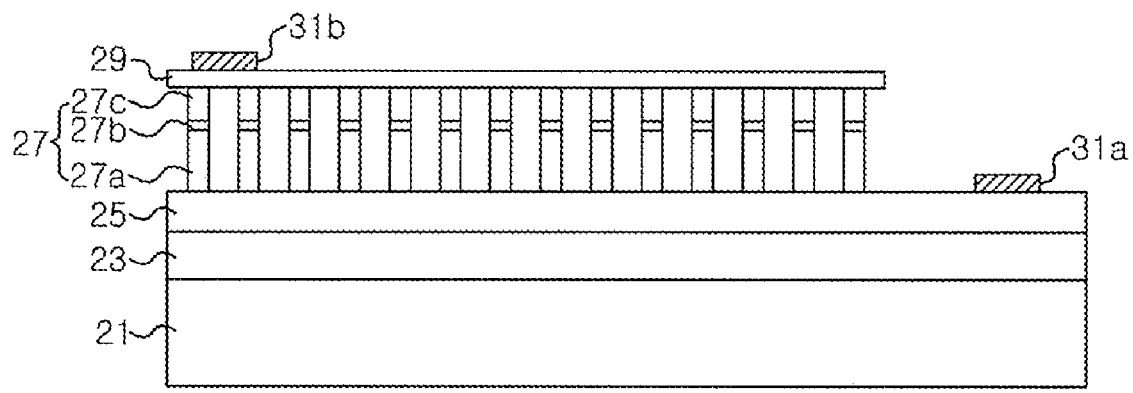

Referring to FIG. 6, lower and upper electrode pads 31a and 31b are formed on an exposed portion of the lower electrode layer 25 and the upper electrode layer 29, respectively. The pads 31a and 31b may be formed using a lift-off process and may be formed through an identical process or different processes. Further, the upper electrode pad 31b may be formed in advance before the lower electrode layer 25 is exposed.

Figure 7:
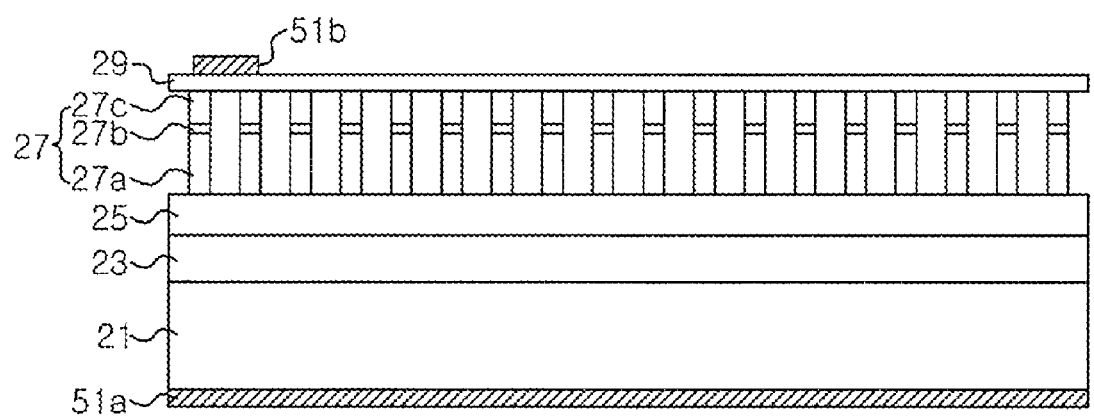
FIG. 7 is a sectional view illustrating a method of fabricating a light emitting diode according to other embodiment of the present invention.

FIG. 7 is a sectional view illustrating a method of fabricating a light emitting diode according to other embodiment of the present invention.

Referring to FIG. 7, a buffer layer 23, a lower electrode layer 25, nanorods 27 and an upper electrode layer 29 are formed on a substrate 21, as described with reference to FIGS. 2 to 4. In this embodiment, the substrate 21 is a conductive substrate, and the buffer layer 23 and/or the lower electrode layer 25 can be omitted. Thus, the nanorods 27 can be grown directly on the substrate 21. Further, a process of patterning the upper electrode layer 29 and the nanorods 27 is omitted.

Meanwhile, an upper electrode pad 51b is formed on the upper electrode layer 29 using a lift-off process. Further, a lower electrode pad 51a is formed on a bottom surface of the substrate 21. The lower electrode pad 51a may be formed in a step of preparing the substrate 21 or in any step thereafter.

According to this embodiment, it is not necessary to pattern the upper electrode layer 29 and the nanorods 27. Thus, there is provided a light emitting diode having a relatively large number of nanorods 27 within the same dimension as the light emitting diode described in the first embodiment, thus resulting in the increase of light output.

The invention claimed is:

1. A light emitting diode, comprising:
   an array of semiconductor nanorods positioned on a substrate; and
   an upper electrode layer deposited on the array such that an empty space remains between adjacent ones of the nanorods,
   wherein the upper electrode layer is continuously positioned on the array of semiconductor nanorods and the empty space, and
   wherein the upper electrode layer comprises a transparent electrode material.

2. The light emitting diode as claimed in claim 1, wherein each of the nanorods comprises a first semiconductor nanorod of a first conductive type, a second semiconductor nanorod of a second conductive type, and an active layer interposed between the first and second semiconductor nanorods.

3. The light emitting diode as claimed in claim 1, wherein the light emitting diode further comprises an upper electrode pad formed on the upper electrode layer.

4. The light emitting diode as claimed in claim 3, further comprising a lower electrode layer of the first conductive type interposed between the substrate and the array, and a lower electrode pad, wherein the nanorods are grown on the lower electrode layer, the lower electrode layer has an extension portion extending from a side of the array of the nanorods, and the lower electrode pad is formed on the extension portion.

5. The light emitting diode as claimed in claim 3, further comprising a lower electrode pad formed on a bottom surface of the substrate, wherein the substrate is a conductive substrate.

6. The light emitting diode as claimed in claim 1, wherein the nanorods are formed at an interval of 200 nm or less on the average.

* * * * *